US007902668B2

(12) United States Patent
Sato

(10) Patent No.: US 7,902,668 B2
(45) Date of Patent: Mar. 8, 2011

(54) FLIP CHIP SEMICONDUCTOR DEVICE INCLUDING AN UNCONNECTED NEUTRALIZING ELECTRODE

(75) Inventor: Koichi Sato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 12/052,280

(22) Filed: Mar. 20, 2008

(65) Prior Publication Data

US 2008/0230903 A1 Sep. 25, 2008

(30) Foreign Application Priority Data

Mar. 22, 2007 (JP) ................................ 2007-074715

(51) Int. Cl.
*H01L 23/58* (2006.01)
*H01L 25/10* (2006.01)
*H01L 21/02* (2006.01)

(52) U.S. Cl. ................ 257/738; 257/777; 257/E23.002; 257/E25.022; 257/E21.002; 438/109

(58) Field of Classification Search .................. 257/737, 257/738, 777, 778, 786
See application file for complete search history.

(56) References Cited

U.S. PATENT DOCUMENTS

2004/0183208 A1* 9/2004 Kumamoto et al. .......... 257/778
2004/0245632 A1* 12/2004 Nagarajan ..................... 257/738
2007/0069346 A1* 3/2007 Lin et al.

FOREIGN PATENT DOCUMENTS

JP 09-232506 9/1997
JP 11-040713 * 2/1999
JP 11040713 A * 2/1999
JP 2001-339046 12/2001
JP 2005-183661 7/2005
JP 2006-332144 12/2006

OTHER PUBLICATIONS

Japanese Office Action corresponding to U.S. Appl. No. 12/052,280 mailed on Jun. 12, 2009.*
Japanese Office Action corresponding to U.S. Appl. No. 12/052,280 mailed on Jun. 29, 2009.*

* cited by examiner

*Primary Examiner* — Marcos D Pizarro
*Assistant Examiner* — Raj Gupta
(74) *Attorney, Agent, or Firm* — Turocy & Watson, LLP

(57) ABSTRACT

A semiconductor chip constitutes a semiconductor device in which a plurality of semiconductor chips are laminated. The semiconductor chip includes a plurality of terminals which are to be connected to another semiconductor chip. At least one terminal of the terminals has a higher height than that of another terminal.

8 Claims, 5 Drawing Sheets chipA
40
42
47
46
chipB
41

FLIP CHIP SEMICONDUCTOR DEVICE INCLUDING AN UNCONNECTED NEUTRALIZING ELECTRODE

CROSS-REFERENCE TO RELATED APPLICATIONS

This application is based upon and claims the benefit of priority from the prior Japanese Patent Application No. 2007-074715, filed on Mar. 22, 2007; the entire contents of which are incorporated herein by reference.

BACKGROUND OF THE INVENTION

1. Field of the Invention

This invention relates to a semiconductor chip, a semiconductor device in which a plurality of semiconductor chips on which semiconductor integrated circuits are formed are electrically connected, and relates to a method for producing a semiconductor device for interfacing the semiconductor chips with performing ESD (Electro Static Discharge) protection between the semiconductor chips.

2. Background Art

Requirement of density growth in the semiconductor industries has become strict not only in the silicon processes but also in the packaging technologies. As well as SoC (system on chip) technique of constructing a system by integrating various semiconductor integrated circuits on one chip, a so-called MCL (multi-chip logic) technique, in which a system is constructed by integrating a plurality of semiconductor integrated circuits and then the plurality of semiconductor integrated circuits are taken in one package (surrounding equipment), has been developed.

Specifically, for example, when there are two chips to be intended to be MCL (multi chip logic) constitution and there is an interfacing IO cell between the two chips, bumps are connected in the IO cell by, for example, putting a solder bump on a connective electrode in a chip A and forming a gold (Au) bump in a chip B for the two semiconductor chips and then contacting and reflowing to melt these bumps. In this case, in the contacted interfacing portions, mobility of charge between the semiconductor chips is generated in the contact of the both bumps, and therefore, it is afraid that ESD destruction is caused. Therefore, it is necessary that ESD protective devices are installed in the bumps of the IOs or of the power source.

However, for providing each of the IOs with independently sufficient ESD resistance, large-size protective devices become required. As a result, the chip sizes become large and this is a large disadvantage for the MCL constitution.

In JP-A 11-40713 (Kokai), there are disclosed an LSI package, in which a terminal array does not slant and insertability of the terminals is maintained to be good, and a packaging system thereof. In the packaging method of the LSI package, after an LSI package is inserted in to an LSI socket, first, position adjustment is performed by the longest positioning terminal, and next, a long earth terminal is connected to prevent electric break due to static electricity or the like, and next, the power is applied. Thus, the terminals are inserted into holes of the LSI sockets in order of lengths of the terminals, and last, all the terminals of the LSI package become in contact with the socket and are connected to a print substrate through the socket. In this case, the LSI socket is pin sockets that are independent for each of the pins, and for example, holes are opened on the print substrate, and the holes are subjected to through-hole plating, and then, the pin sockets are inserted thereinto and soldered.

SUMMARY OF THE INVENTION

According to an aspect of the invention, there is provided a semiconductor chip which constitutes a semiconductor device in which a plurality of semiconductor chips are laminated, including a plurality of terminals which are to be connected to another semiconductor chip, at least one terminal of the terminals having a higher height than that of another terminal.

According to another aspect of the invention, there is provided a semiconductor device including a plurality of semiconductor chips which are laminated, comprising a plurality of terminals which are connecting two adjacent semiconductor chips, at least one terminal of the plurality of terminals being bigger than another terminal.

According to another aspect of the invention, there is provided a semiconductor device including a plurality of semiconductor chips which are laminated, at least one of two adjacent semiconductor chips including a neutralizing electrode which is not connected to other of the two adjacent semiconductor chips.

According to another aspect of the invention, there is provided a method for producing a semiconductor device in which a plurality of semiconductor chips each having a plurality of terminals are laminated, including contacting at least one terminal in one semiconductor chip out of the plurality of terminals that are electrically connecting two adjacent semiconductor chips with one terminal in other semiconductor chip, before another terminal in the one semiconductor chip is contacted to another terminal in the other semiconductor chip.

DETAILED DESCRIPTION OF THE INVENTION

Hereinafter, embodiments of the invention will now be described with reference to Examples.

FIRST EXAMPLE

Hereinafter, Example 1 will be explained with reference to FIGS. 1 to 3.

Figure 1:
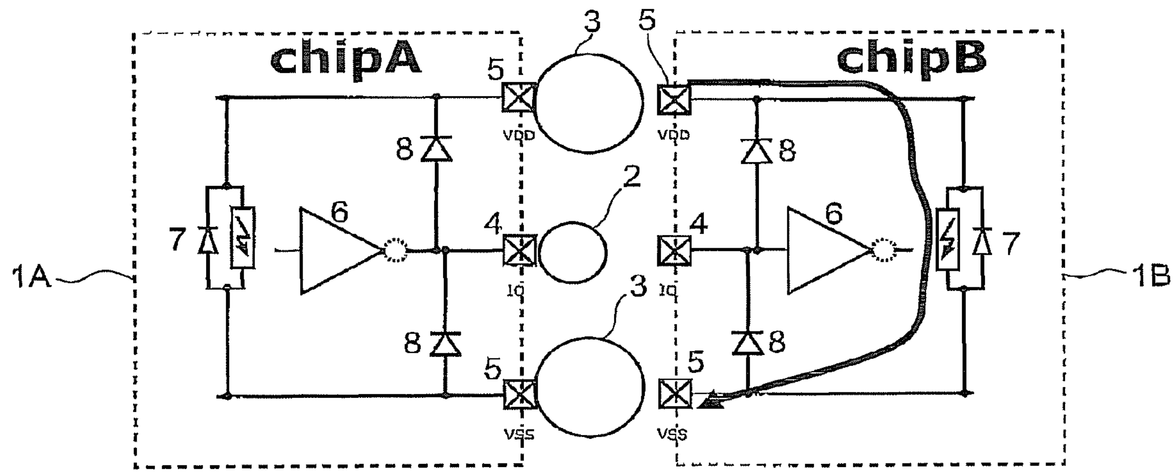
FIG. 1 is a schematic cross-section view of semiconductor chips according to an example 1 for explaining a step of forming an interfacing part with connecting the semiconductor chips.
Figure 2A:
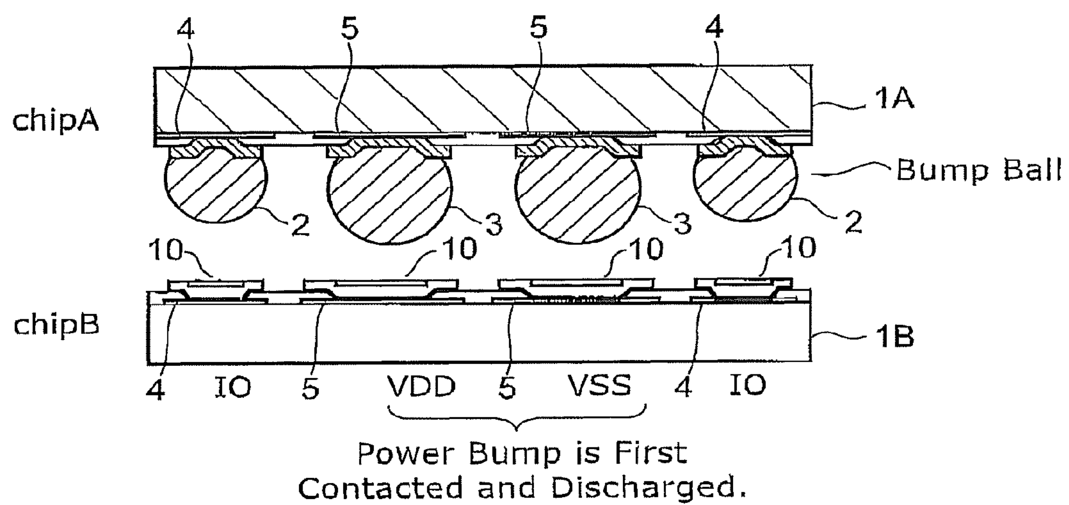
FIGS. 2A and 2B are partially expanded cross-section views of the semiconductor chips shown in FIG. 1.
Figure 2B:
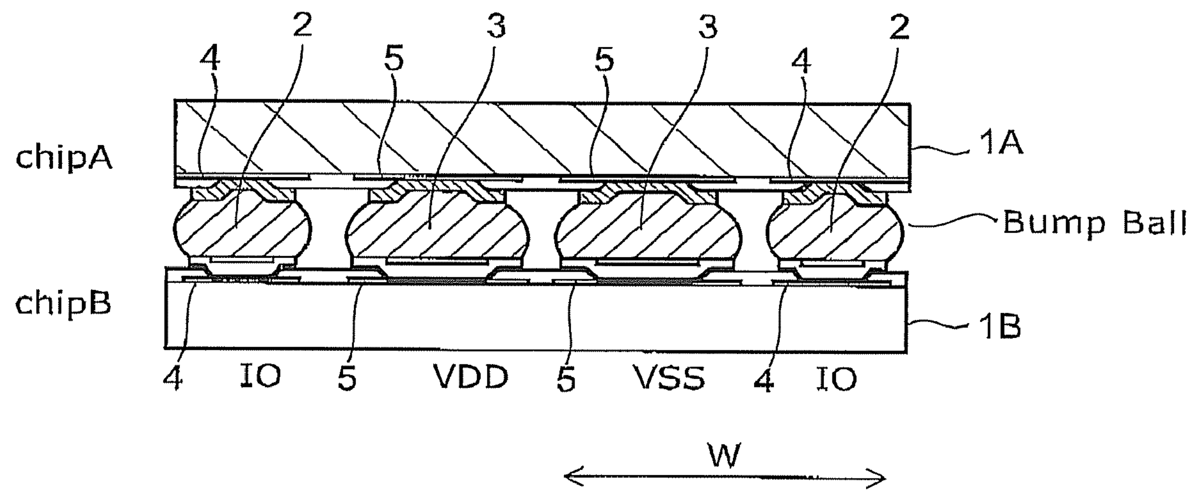
Figure 3:
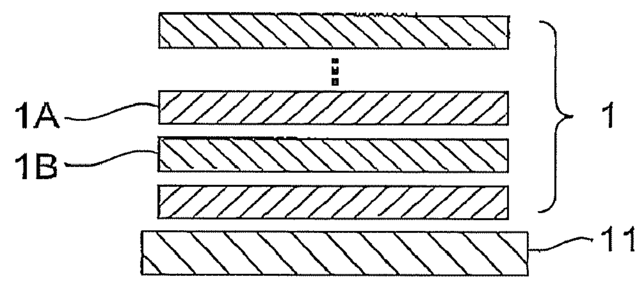
FIG. 3 is a schematic cross-section view of a semiconductor device according to the example 1 formed by laminating a plurality of semiconductor chips.

FIG. 1 is a schematic cross-section view of semiconductor chips for explaining a step of forming an interfacing part with connecting the semiconductor chips, and FIGS. 2A and 2B are partially enlarged cross-section views of the semiconductor chips shown in FIG. 1, and FIG. 3 is a schematic cross-section view of a semiconductor device formed by laminating a plurality of semiconductor chips.

The semiconductor device of this Example is applicable to, for example, an MCL-type semiconductor device, and includes a plurality of laminated semiconductor chips 1 each having a plurality of terminals. One part of the terminals in at least one semiconductor chip 1A, 1B out of the plurality of terminals that are electrically connecting two contiguous semiconductor chips 1A, 1B is formed so as to be higher than the other terminals formed in the one semiconductor chip.

In FIG. 1, a plurality of semiconductor chips 1 including the two contiguous semiconductor chips 1A, 1B are laminated on a substrate 11. The laminated body of the semiconductor chips is sealed in a package according to need.

FIG. 2A shows a step of forming an interfacing part by connecting one pair of contiguous semiconductor chips 1A, 1B, in the laminated body of the semiconductor chips 1. In the semiconductor chips 1A, 1B, connective electrodes 4, 5 to be connected to integrated circuits inside the semiconductor chips are formed. And, in the connective electrodes 4, 5 in the semiconductor chip 1A (chip A), terminals 2, 3 that are called as solder balls are formed. The ball terminals 3 are power terminals (VDD, VSS) to be connected to the power source, and the ball terminals 2 are signal terminals (IO) to be connected to the inside integrated circuits through a buffer circuit 6. An inter-power protective device 7 is provided between the connective electrodes 5, and a protective diode 8 is connected between the connective electrode 4 and the connective electrode 5. Gold (Au) bumps 10 are formed in connective electrodes 4, 5 of the semiconductor chip 1B (chip B), and the ball terminals 2, 3 are put thereon and bonded thereto.

As shown in FIG. 2A, gold bumps 10 are bonded to the connective electrodes 4, 5 on the semiconductor chip 1B. The gold bump 10 on every connective electrode 10 has the approximately same height. The semiconductor chip 1A is placed opposite onto the semiconductor chip 1B. Solder bumps (ball terminals) 2, 3 are bonded to the connective electrodes 4, 5 on the semiconductor chip 1A. The ball terminal 3 has a larger diameter than that of the ball terminal 2 and is represented by the formula:

Diameter of Ball Terminal 3>Diameter of Ball Terminal 2

That is, the ball terminal 3 has a higher height than that of the ball terminal 2.

When the semiconductor chip 1A and the semiconductor chip 1B are placed opposite to each other and then the semiconductor chip 1A is lowered with being horizontally maintained (or, the semiconductor chip 1B is raised), first, the ball terminals 3 are contacted with the gold bumps 10 of the semiconductor chip 1B and next the ball terminals 2 are contacted with the gold bumps 10. In such a contact state, these terminals and the bumps are contacted and reflowed, and thereby the solder balls are melted to be connected as show in FIG. 2B. In this case, in the contacted interfacing part, mobility of charge between the semiconductor chips is generated in the contact of the both bumps, and therefore, it is afraid that ESD destruction is caused. Therefore, it is necessary that ESD protective devices are installed in the bumps of the IOs or of the power source. As shown in FIG. 2B the ball terminal 3 is bigger than ball terminal 2 after connecting the semiconductor chips 1A and 1B because the ball terminal 3 is bigger than the ball terminal 2 before connecting the semiconductor chips 1A and 1B as shown in FIG. 2A.

As this Example, first, the sizes of the bumps are adjusted so that the bumps for the power-source parts are enlarged to be contacted before the bumps for IO parts are contacted. Thereby, the charge mobility through the power source is first performed. In the semiconductor chips before the contact, the charge remaining in the power-source system is the largest, and additionally, the inter-power protective devices having sufficient sizes are originally integrated in the both semiconductor chips, and therefore, when charge of the power source is first discharged through the inter-power protective device as shown in the arrow of FIG. 1, the ESD protection of the IO parts to be contacted later is relaxed and it becomes possible to minimize the protective device size of the IO parts.

SECOND EXAMPLE

Next, Example 2 will be explained with reference to FIG. 4.

Figure 4:
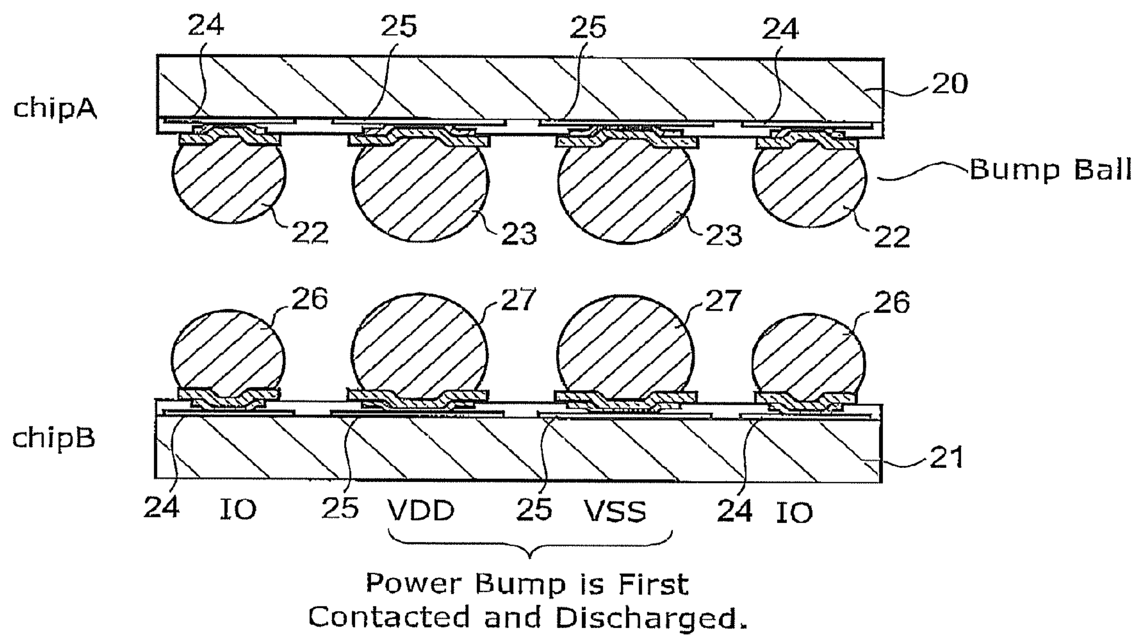
FIG. 4 is a partially expanded cross-section view of the semiconductor chips according to an example 2 for explaining a step of forming an interfacing part by connecting the semiconductor chips.

FIG. 4 is a partially expanded cross-section view of the semiconductor chips for explaining a step of forming an interfacing part by connecting the semiconductor chips.

The semiconductor device of this Example is applicable to, for example, an MCL-type semiconductor device, and includes a plurality of laminated semiconductor chips each having a plurality of terminals. One part of the terminals in at least one semiconductor chip out of the plurality of terminals that are electrically connecting two contiguous semiconductor chips 20, 21 is formed so as to be higher than the other terminals formed in the one semiconductor chip.

In the semiconductor chips 20, 21, connective electrodes 24, 25 to be connected to integrated circuits inside the semiconductor chips are formed. And, in the connective electrodes 24, 25 in the semiconductor chip 20 (chip A), terminals 22, 23 that are called as solder balls are formed. The ball terminals 23 are power terminals (VDD, VSS) to be connected to the power source, and the ball terminals 22 are signal terminals (IO) to be connected to the inside integrated circuits through a buffer circuit. An inter-power protective device is provided between the connective electrodes of the semiconductor chips 20, 21, and a protective diode is connected between the connective electrode 24 and the connective electrode 25.

The characteristics of this Example are that ball terminals 26, 27 are formed also on connective electrodes 24, 25 in the semiconductor chip 21 (chip B) and that the ball terminals 22, 23 of the semiconductor chip 20 are put thereon and bonded thereto.

As shown in FIG. 4, the ball terminals 26, 27 are bonded to the connective terminals 24, 25 on the semiconductor chip 21. The ball terminal 27, which is a power terminal, has a larger diameter and a higher height than those of the ball terminal 26, which is a signal terminal. Onto the semiconductor chip 21, the semiconductor chip 20 is placed opposite. Solder bumps (ball terminals) 22, 23 are bonded to the connective electrodes 24, 25 on the semiconductor chip 20. The ball terminal 23 has a larger diameter than that of the ball terminal 22. That is, the ball terminal 23 has a higher height than that of the ball terminal 22.

When the semiconductor chip 20 and the semiconductor chip 21 are placed opposite to each other and then the semiconductor chip 1A is lowered with being horizontally maintained (or, the semiconductor chip 21 is raised), first, the ball terminals 23 are contacted with the ball terminals 27 of the semiconductor chip 21 and next the ball terminals 22 are contacted with the ball terminals 26. In such a contact state, these terminals are contacted and reflowed, and thereby the solder balls are melted to be connected. In this case, in the contacted interfacing part, mobility of charge between the semiconductor chips is generated in the contact of the both bumps, and therefore, it is afraid that ESD destruction is caused. Therefore, it is necessary that ESD protective devices are installed in the IO terminals or the power terminals. After connecting the semiconductor chips 20 and 21, the ball terminals 23 and 27 are bigger than the ball terminals 22 and 26 as described with reference to FIG. 2B.

As described above, by preferentially first neutralizing specific terminals subjected sufficiently to measures of ESD protective device, the sizes of the protective devices of the other terminals can be made to be small, and thereby, the ESD protective device size can be made to be small as a whole of the chips.

In addition, all the ball terminals of the semiconductor chip 21 can be made to have the same size.

As this Example, first, the sizes of the bumps are adjusted so that the bumps for the power-source parts are enlarged to be contacted before the bumps for IO parts are contacted. Thereby, the charge mobility through the power source is first performed. In the semiconductor chips before the contact, the charge remaining in the power-source system is the largest, and additionally, sufficient sizes of the inter-power protections are originally internalized in the both semiconductor chips, and therefore, when charge of the power source is first discharged through the inter-power protective device, the ESD protection of the IO parts to be contacted later is relaxed and it becomes possible to minimize the protective device size of the IO parts.

THIRD EXAMPLE

Next, Example 3 will be explained with reference to FIG. 5.

Figure 5:
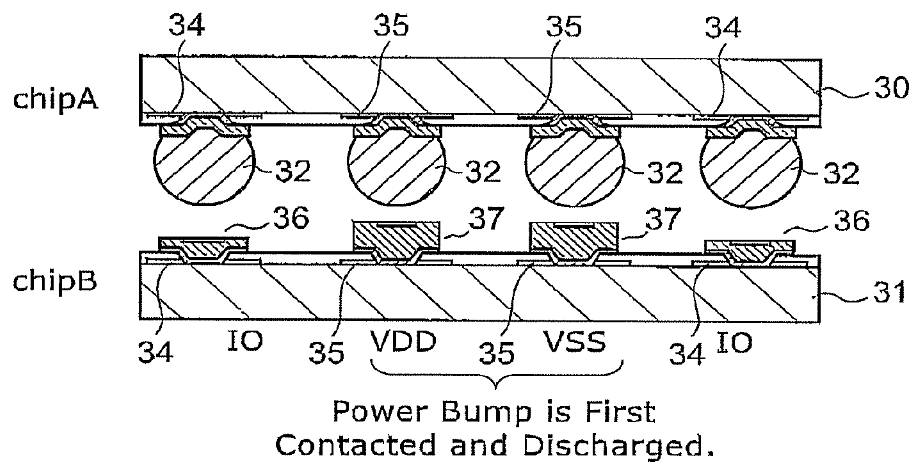
FIG. 5 is a partially expanded cross-section view of the semiconductor chips according to an example 3 for explaining a step of forming an interfacing part by connecting the semiconductor chips.

FIG. 5 is a partially expanded cross-section view of the semiconductor chips for explaining a step of forming an interfacing part by connecting the semiconductor chips. The characteristics of this Example are that all the ball terminals have the same size and that gold bumps having different heights are used.

The semiconductor device of this Example is applicable to, for example, an MCL-type semiconductor device, and includes a plurality of laminated semiconductor chips each having a plurality of terminals. One part of the terminals in at least one semiconductor chip 30, 31 out of the plurality of terminals that are electrically connecting two contiguous semiconductor chips 30, 31 is formed so as to be higher than the other terminals formed in the one semiconductor chip.

In the semiconductor chips 30, 31, connective electrodes 34, 35 to be connected to integrated circuits inside the semiconductor chips are formed. And, in the connective electrodes 34, 35 in the semiconductor chip 30 (chip A), terminals 32 that are called as solder balls are formed. The ball terminals 32 are power terminals (VDD, VSS) to be connected to the power source, and the ball terminals 32 are signal terminals (IO) to be connected to the inside integrated circuits through a buffer circuit. An inter-power protective device is provided between the connective electrodes 35, and a protective diode is connected between the connective electrode 34 and the connective electrode 35. Gold (Au) bumps 36, 37 are formed in connective electrodes 34, 35 of the semiconductor chip 30 (chip B), and in connection, the ball terminals 32 are put thereon and bonded thereto.

As shown in FIG. 5, gold bumps 36 are bonded to the connective electrodes 34, 35 on the semiconductor chip 31. The gold bumps 37 formed on the connective electrodes 35 are formed higher than the gold bumps 36. The semiconductor chips 30 are placed opposite onto the semiconductor chip 31. Solder bumps (ball terminals) 32 are bonded to the connective electrodes 34, 35 on the semiconductor chip 30. All the ball terminals 32 have the same ball diameter.

When the semiconductor chip 30 and the semiconductor chip 31 are placed opposite to each other and then the semiconductor chip 30 is lowered with being horizontally maintained (or, the semiconductor chip 31 is raised), first, the ball terminals 32 are contacted with the gold bumps 37 of the semiconductor chip 31 and next the ball terminals 32 are contacted with the gold bumps 36. In such a contact state, these terminals and the bumps are contacted and reflowed, and thereby the solder balls are melted to be connected. In this case, in the contacted interfacing part, mobility of charge between the semiconductor chips is generated in the contact of the both bumps, and therefore, it is afraid that ESD destruction is caused. Therefore, it is necessary that ESD protective devices are installed in the IO terminals or the power terminals. After connecting the semiconductor chips 30 and 31, the gold bump 37 is bigger than the gold bump 36 as described with reference to FIG. 2B.

As this Example, first, the sizes of the bumps are adjusted so that the bumps for the power-source parts are enlarged to be contacted before the bumps for IO parts are contacted. Thereby, the charge mobility through the power source is first performed. In the semiconductor chips before the contact, the charge remaining in the power-source system is the largest, and additionally, sufficient sizes of the inter-power protections are originally internalized in the both semiconductor chips, and therefore, when charge of the power source is first discharged through the inter-power protective device, the ESD protection of the IO parts to be contacted later is relaxed and it becomes possible to minimize the protective device size of the IO parts.

FOURTH EXAMPLE

Next, Example 4 will be explained with reference to FIG. 6.

FIG. 6 is a partially expanded cross-section view of the semiconductor chips for explaining a step of forming an interfacing part by connecting the semiconductor chips. The characteristics of this Example are in using a neutralizing electrode and in a method of forming an interfacing part.

On the other hand, all the ball terminals 42 provided on one semiconductor chip 40 have the same size, and also, all the gold bumps 46 provided on the other semiconductor chip 41 have the same size. On this the other semiconductor chip 41, an electrode for neutralization is provided, and thereon, a gold bump 47 thicker than the other gold bumps is provided.

The semiconductor device of this Example is applicable to, for example, an MCL-type semiconductor device, and includes a plurality of laminated semiconductor chips each having a plurality of terminals protective device. In the semiconductor chips 40, 41, connective electrodes to be connected to integrated circuits inside the semiconductor chips are formed. And, in the connective electrodes in the semiconductor chip 40, terminals 42 that are called as solder balls are formed. The ball terminals 42 are power terminals to be connected to the power source, and the ball terminals 42 are signal terminals (IO) to be connected to the inside integrated circuits through a buffer circuit. An inter-power protective device is provided between the connective electrodes, and a protective diode is connected between the connective electrode and the signal terminal. Gold (Au) bumps 46, 47 are formed in connective electrodes of the semiconductor chip 41, and in connection, the ball terminals 42 are put thereon and bonded thereto.

Figures 6A, 6B:
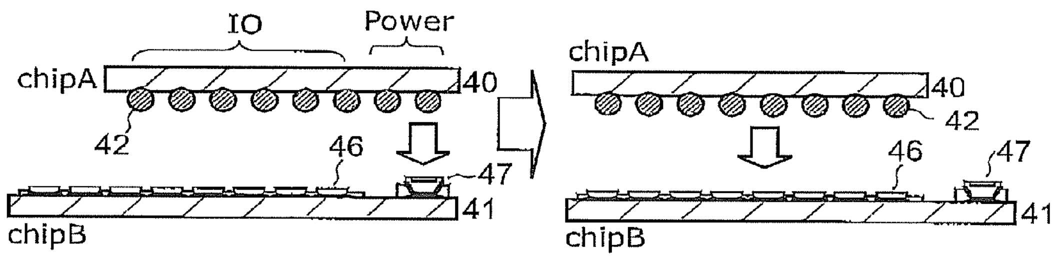
FIGS. 6A through 6C are partially expanded cross-section views of the semiconductor chips according to an example 4 for explaining a step of forming an interfacing part by connecting the semiconductor chips.

The semiconductor chip 40 is placed opposite onto the semiconductor chip 41. When the semiconductor chip 40 and the semiconductor chip 41 are placed opposite to each other and then the semiconductor chip 40 is lowered with being horizontally maintained (or, the semiconductor chip 41 is raised), first, the ball terminals 42 for the power source are contacted with the gold bumps 47 for neutralization of the semiconductor chip 41 and thereby to be discharged (FIG. 6A). Next, after sufficiently performing neutralization, the semiconductor chips 40, 41 are maintained in a parallel state and therewith moved until the gold bumps 46 of the semiconductor chip 41 and the ball terminals 42 of the semiconductor chip 40 come to have a predetermined positional relation. Next, with maintaining the parallel state, the predetermined ball terminals 42 are contacted with the predetermined gold bumps 46 located in the opposite positions. In such a contact state, these terminals and the bumps are contacted and reflowed, and thereby the solder balls are melted to be connected (FIG. 6B). In this case, in the contacted interfacing part, mobility of charge between the semiconductor chips is generated in the first contact of the both bumps, and therefore, it is afraid that ESD destruction is caused. Therefore, it is necessary that ESD protective devices are installed in the IO terminals or the power terminals.

Figure 6C:
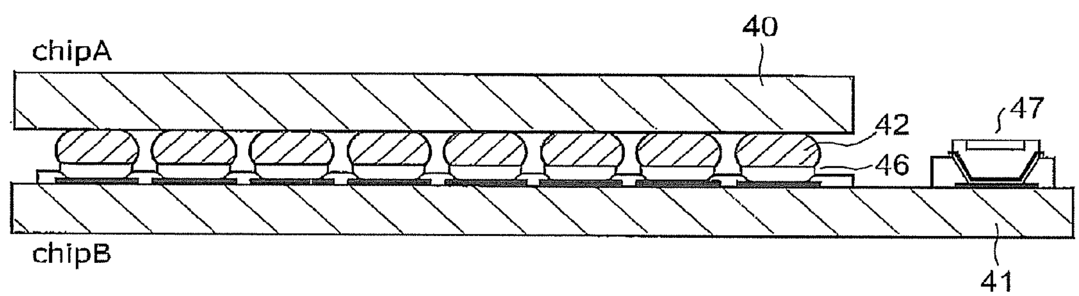

FIG. 6C shows a semiconductor device made by connecting the semiconductor chips 40 and 41. As shown in FIG. 6C, the gold bump 47 for neutralization is not connected to the semiconductor chip 40 and is exposed.

As this Example, first, the neutralization treatment is performed by using a terminal for neutralization and then the ball terminals and the gold bumps are bonded. Thereby, the charge of the power source is discharged, and the ESD protection is relaxed, and it becomes possible to minimize the protective device size of the signal (IO) parts. That is, a specific ball terminal (such as terminal for power source) sufficiently having an ESD protective device is preliminarily contacted with a special terminal for neutralization and then the semiconductor chips are contacted with each other.

In the Example, the bump thicker than the other gold bumps is used as the terminal for neutralization but the bump may be the same thick as the other gold bumps. In this case, it is necessary to contrive that the terminal for neutralization is placed in the periphery of the other semiconductor chip and that one semiconductor chip is slightly inclined so that the ball terminal is contacted with the terminal for neutralization of the other semiconductor chip.

FIFTH EXAMPLE

Next, Example 5 will be explained with reference to FIG. 7.

Figures 7A, 7B:
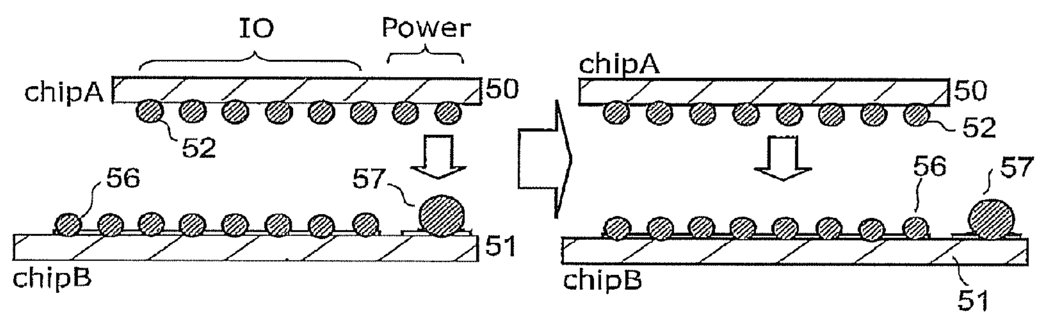
FIGS. 7A and 7B are partially expanded cross-section views of the semiconductor chips according to an example 5 for explaining a step of forming an interfacing part by connecting the semiconductor chips.

FIG. 7 is a partially expanded cross-section view of the semiconductor chips for explaining a step of forming an interfacing part by connecting the semiconductor chips. The characteristics of this Example are in using a neutralizing electrode and in a method of forming an interfacing part.

On the other hand, all the ball terminals 52 provided on one semiconductor chip 50 have the same size, and also, all the ball terminals 56 provided on the other semiconductor chip 51. On this the other semiconductor chip 51, an electrode for neutralization is provided, and thereon, a ball terminal 57 having a large diameter than the other ball terminals is provided.

This Example has a difference in using ball terminals as the other terminals but is the same as Example 4 in the other respects and has the same working effects. After connecting the semiconductor chips 50 and 51, the ball terminal 57 connected to the electrode for neutralization is not connected to the semiconductor chip 50 and is exposed.

In this Example, the ball terminal having a larger diameter than that of the other ball terminals is used as the terminal for neutralization but the bump may be the same thick as the other gold bumps. In this case, it is necessary to contrive that the terminal for neutralization is placed in the periphery of the other semiconductor chip and that one semiconductor chip is slightly inclined so that the ball terminal is contacted with the terminal for neutralization of the other semiconductor chip.

SIXTH EXAMPLE

Next, Example 6 will be explained with reference to FIG. 8.

Figure 8A:
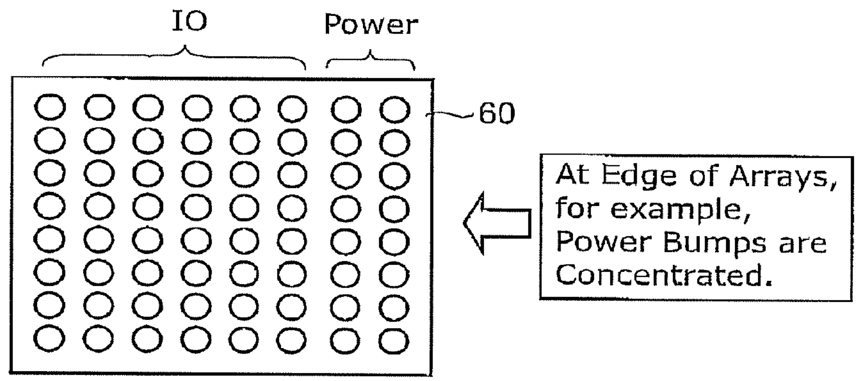
FIG. 8A is a partially expanded plan view and FIG. 8B is a partially expanded cross-section view of the semiconductor chips according to an example 6 for explaining a step of forming an interfacing part by connecting the semiconductor chips, respectively.
Figure 8B:
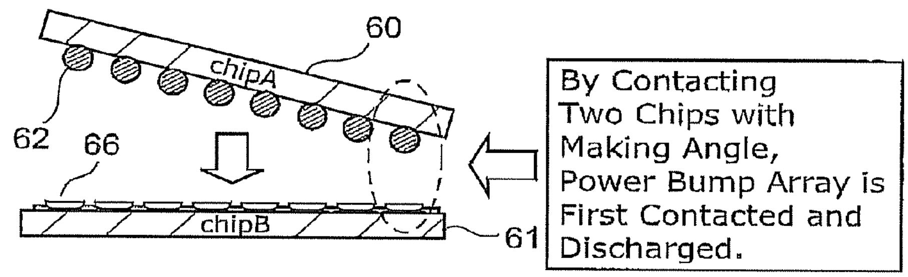

FIG. 8 is a partially expanded cross-section view of the semiconductor chips for explaining a step of forming an interfacing part by connecting the semiconductor chips. The characteristics of this Example are in not using a neutralizing electrode and in a method of forming an interfacing part. The semiconductor device of this Example has a difference in having no terminal for neutralization but is the same as Example 4 in the other constitutions.

All the ball terminals 62 provided on one semiconductor chip 60 have the same size, and also, all the gold bumps 66 formed on the other semiconductor chip 61 have the same size. In this Example, in the edge of the terminal arrays, for example, the power terminals are concentrated. One semiconductor chip is slightly inclined so that the ball terminals 62, which are power terminals, are contacted with the gold bumps that are the corresponding power terminals in the other semiconductor chip before the other terminals are contacted. Then, the other ball terminals are contacted. That is, at the edge of the arrays, specific bumps (such as power bumps) sufficiently having the ESD protective device are concentrated, and contacted and discharged from the power bump array.

SEVENTH EXAMPLE

Next, Example 7 will be explained with reference to FIG. 9.

Figure 9:
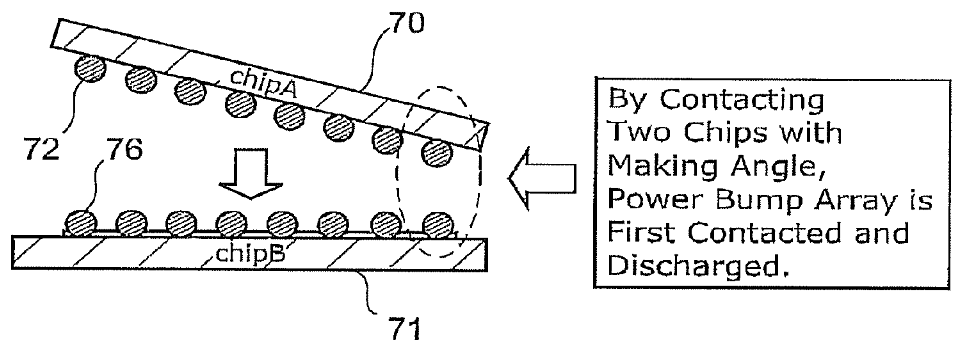
FIG. 9 is a partially expanded cross-section view of the semiconductor chips according to an example 7 for explaining a step of forming an interfacing part by connecting the semiconductor chips.

FIG. 9 is a partially expanded cross-section view of the semiconductor chips for explaining a step of forming an interfacing part by connecting the semiconductor chips. The semiconductor device of this Example has a difference from Example 6 in using the ball terminals in the other semiconductor chips but is the same as Example 6 in the other constitutions and working effects.

All the ball terminals 72 provided on one semiconductor chip 70 have the same size, and also, all the ball terminals 76 formed on the other semiconductor chip 71 have the same size. In this Example, in the edge of the terminal arrays, for example, the power terminals are concentrated. One semiconductor chip is slightly inclined so that the ball terminals 72, which are power terminals, are contacted with the ball terminals that are the corresponding power terminals in the other semiconductor chip before the other terminals are contacted. Then, the other ball terminals are contacted. That is, at the edge of the arrays, specific bumps (such as power bumps) sufficiently having the ESD protective device are concentrated, and contacted and discharged from the power bump array.

The invention claimed is:

1. A semiconductor chip which constitutes a semiconductor device in which a plurality of semiconductor chips are laminated, comprising:

a plurality of terminals which are to be connected to another semiconductor chip except one terminal of the terminals; and a neutralizing electrode, wherein the one terminal has a higher height than that of another terminal, the one terminal is connected to the neutralizing electrode and is not connected to the another semiconductor chip, the another terminal is a power terminal, and the neutralizing electrode is configured to discharge the one terminal and is located outside an array of the plurality of terminals except the one terminal.

2. The semiconductor chip according to claim 1, wherein the one terminal is located outside the another semiconductor chip in plain view as viewed from above.

3. The semiconductor chip according to claim 1, wherein each of the terminals is a ball terminal or a gold bump.

4. The semiconductor chip according to claim 1, wherein the plurality of terminals include a power terminal and a signal terminal, the one terminal is a power terminal, and the another terminal is a signal terminal.

5. The semiconductor chip according to claim 4, wherein a protective device is connected to the power terminal.

6. The semiconductor chip according to claim 4, wherein the plurality of terminals include a second power terminal having a higher height than that of the signal terminal.

7. A semiconductor device comprising a plurality of semiconductor chips which are laminated, wherein two adjacent semiconductor chips are connected via a plurality of terminals, one of the two adjacent semiconductor chips includes a neutralizing electrode which is not connected to other of the two adjacent semiconductor chips, the plurality of terminals includes a power terminal, and the neutralizing electrode is configured to discharge one of the plurality of terminals and is located outside an array of the plurality of terminals.

8. The semiconductor device according to claim 7, wherein the neutralizing electrode is located outside the other of the two adjacent semiconductor chips in plain view as viewed from above.

* * * * *